United States Patent [19]

Martin et al.

[11] Patent Number: 5,012,324
[45] Date of Patent: Apr. 30, 1991

[54] FLAT BODY, PARTICULARLY FOR USE AS A HEAT SINK FOR ELECTRONIC POWER COMPONENTS

[75] Inventors: Wolfram Martin, Birkenfeld; Brigitte Waibel, Pforzheim, both of Fed. Rep. of Germany

[73] Assignee: Doduco GmbH and Co. Dr. Eugen Durrwachter, Pforzheim, Fed. Rep. of Germany

[21] Appl. No.: 328,154
[22] PCT Filed: Jun. 27, 1988
[86] PCT No.: PCT/EP88/00564
  § 371 Date: Feb. 24, 1989
  § 102(e) Date: Feb. 24, 1989
[87] PCT Pub. No.: WO89/00339
  PCT Pub. Date: Jan. 12, 1989

[30] Foreign Application Priority Data

Jul. 3, 1987 [DE] Fed. Rep. of Germany ....... 3721958

[51] Int. Cl.$^5$ ............................................. H01L 23/36
[52] U.S. Cl. ............................................. 357/81; 357/80
[58] Field of Search .................... 357/67, 81, 71, 80; 165/42, 43, 44, 51, 52, 53, 54, 57, 80.2, 80.3

[56] References Cited

U.S. PATENT DOCUMENTS 3,717,798  2/1973  Kahn .................................. 357/67
3,829,598  8/1974  Darnell .............................. 357/81
4,556,899  12/1985  Kurihara et al. ................. 357/67

*Primary Examiner*—Rolf Hille
*Assistant Examiner*—S. V. Clark
*Attorney, Agent, or Firm*—Dvorak and Traub

[57] ABSTRACT

The bodies consist of a ceramic slab (1), which is covered on both sides by metal plates (2, 3), which are firmly bonded to the ceramic slab (1) throughout their contact surface without an interlayer and have marginal strips (5) which are reduced in thickness.

17 Claims, 1 Drawing Sheet

FLAT BODY, PARTICULARLY FOR USE AS A HEAT SINK FOR ELECTRONIC POWER COMPONENTS

This invention relates to a flat body having the features recited in the prior art part of claim 1. Such flat bodies may consist, e.g., of a thin alumina slab, which is covered on both sides by respective metal plates, and are known as heat sinks for electronic power components, e.g. in igniting devices for Otto engines in automobiles. At such locations said bodies must have a high resistance to thermal shock. The resistance of the previously known bodies to thermal shock is inadequate because the coefficients of thermal expansion of the ceramic slab, on the one hand, and of the metal plates, on the other hand, differ greatly so that temperature changes in the body will give rise to correspondingly strongly changing tensile and compressive stresses which are parallel to the surface and may result in the ceramic slab in a fracture which is parallel to the surface (conchoid fracture). The resistance to thermal shock will be inadequate particularly if the metal plates are joined to the ceramic slab without an interlayer (direct bonding process). The thermal stresses which occur may be compensated in part by an interlayer of a solder alloy which has a high ductility.

It is an object of the invention to provide flat bodies which are of the kind described first hereinbefore and have an improved resistance to thermal shock.

That object is accomplished by flat bodies having the features recited in claim 1. Advantageous further developments of the invention are a subject matter of the dependent claims.

It has been found that a substrate which is covered by metal plates on both sides will have a much higher resistance to temperature shock if the metal plates have marginal strips reduced in thickness. To provide such marginal strips, the metal plates may be beveled and a bevel at an angle of about 20° to the surface of the ceramic slab is particularly suitable. But it is preferred to use metal plates which are reduced in thickness at the edge by being stepped. Marginal strips defined by a single step will be sufficient to effect a substantial increase of the resistance to temperature shock. But the resistance to temperature shock can be further improved if the thickness of the metal plates is reduced toward the edge in a plurality of steps. Where only a single step is provided, it will be recommendable to provide a marginal strip in a thickness of 40 to 50%, most preferably a thickness of about 45%, of the thickness of the metal plates.

The width of the marginal strips which are reduced in thickness is suitably 1 to 3 times, most preferably 1.5 to 2 times, the thickness of the metal plates.

The greatest improvement of the resistance to thermal shock will be achieved if the metal plates are provided with marginal strips which are reduced in thickness at all edges, i.e., all around their periphery. If this is not desired, however, for the sake of a less expensive manufacture, it will be recommendable to provide the metal plates at mutually opposite edges with marginal strips reduced in thickness. From the aspect of manufacturing technology it will be particularly suitable to use rectangular metal plates which are stepped at two parallel edges; such metal plates may continually be made from a metal strip which is milled at its two longitudinal edges to provide the thinner marginal strips and which is subsequently divided into individual metal plates.

In order to achieve a high resistance to thermal shock it is also recommended to provide identical and coextensive metal plates on both sides of the ceramic slab so that the ceramic slab will not be subjected to also to flexural stresses in case of a temperature change.

In accordance with the invention it is particularly possible to make bodies which have a high resistance to thermal shock and consist of a thin ceramic slab which is directly bonded to metal plates made of a material which has a particularly high thermal conductivity, particularly copper. The disadvantage which is involved in known bodies laminated by direct bonding relative to soldered bodies as regards the resistance to thermal shock will be more than compensated if the bodies are designed in accordance with the invention so that the field of application of the direct bonding process as a joining process is increased. The invention is obviously also applicable to such bodies which have been assembled like a sandwich and have been joined by methods other than direct bonding, particularly by soldering. Whereas the material selected for the ceramic slabs will suitably consist of alumina, other ceramic materials, particularly aluminum nitride and beryllium oxide, may also be used, of course.

In the preferred use of the bodies as heat sinks for electronic power components it is preferred to select thicknesses between 0.5 mm and 1 mm for the ceramic slabs and for the metal plates.

In the drawing which is attached for a further explanation of the invention,

For the sake of simplicity, mutually corresponding parts have been designated with the same reference characters in the various figures.

Figure 1:
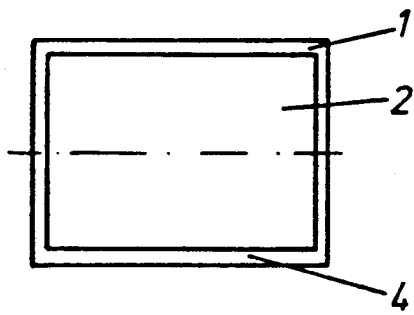
FIG. 1 is a top plan view showing a flat body in accordance with the prior art.

In all three examples the body consists of a thin rectangular ceramic slab 1, which is provided on its top surface with a directly bonded metal plate 2 and on its bottom surface with a directly bonded metal plate 3, which is identical to the metal plate 2. The metal plates 2, 3 are also rectangular and are somewhat smaller than the ceramic slab 1 and are centered on the ceramic slab 1 so that the marginal strip 4 of the ceramic slab protrudes between the metal plates 2 and 3. The thickness of the metal plates 2 and 3 is of the same order as the thickness of the ceramic slab 1.

Figure 2:
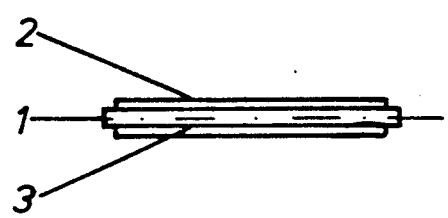
FIG. 2 is a side elevation showing the same body.
Figure 3:
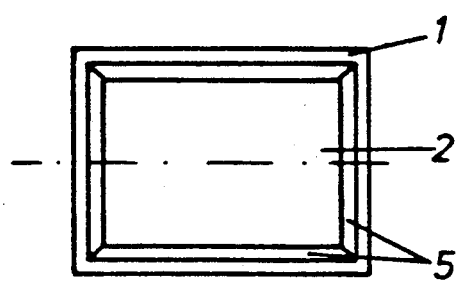
FIG. 3 is a top plan view showing a body in accordance with the invention provided with beveled metal plates.
Figure 4:
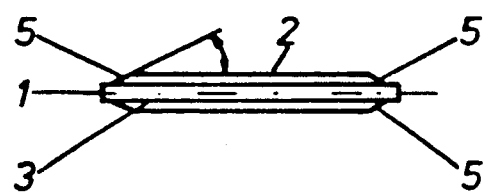
FIG. 4 is a side elevation showing the body of FIG. 3.
Figure 5:
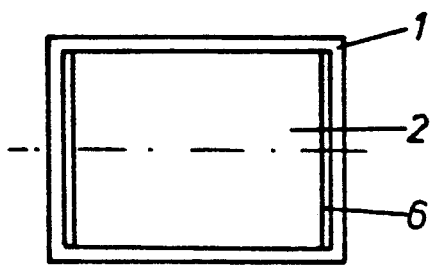
FIG. 5 is a top plan view showing a body in accordance with the invention which has stepped marginal portions and FIG. 6 is a side elevation showing the body of FIG. 5.
Figure 6:
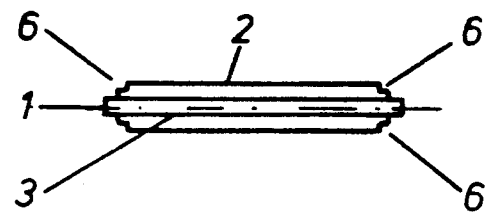

In the body which is known in the art and shown in FIGS. 1 and 2 the metal plates 2 and 3 are flat parallelepipeds. In the two illustrative embodiments shown in FIGS. 3 to 6 the metal plates have marginal strips 5 and 6, which are reduced in thickness. In the illustrative embodiment which is shown in FIGS. 3 and 4 the marginal strip 5 is defined by beveled surfaces and is provided at all four edges of the metal plates 2 and 3. In the illustrative embodiment shown in FIGS. 5 and 6 a thinner marginal strip 6 is provided at each of the two ends of the metal plates 2 and 3, where the highest thermal stresses occur, in that the metal plates are formed there with respective steps having a thickness which is less than one-half of the thickness of the metal plates.

To illustrate the technical progress the results of comparison tests will now be reported which have been conducted with bodies such as are shown in FIGS. 1 to 6.

In all cases, alumina ceramic slabs were used which had the following dimensions:

| Length | 23.2 mm |
|---|---|
| Width | 13.2 mm |
| Thickness | 0.635 mm | and which were laminated with directly bonded copper plates having the following dimensions:

| Length | 21.0 mm |
|---|---|
| Width | 11.0 mm |
| Thickness | 0.65 mm |

In the illustrative embodiment shown in FIGS. 3 and 4 the marginal strips 5 were beveled at an angle of 20% to the surface of the ceramic slab 1. In the illustrative embodiment shown in FIGS. 5 and 6, marginal strips 6 were provided in a width of 1.0 mm and a thickness of 0.3 mm. A relatively large number of test specimens were subjected to stresses which were due to temperature changes between −40° C. and +110° C. Each test specimen was held at each of the lower and higher temperatures for 40 minutes and was rearranged between the lower and higher temperatures during a rearranging time not in excess of 10 seconds.

The following Table indicates the percentage of test speciments which failed after thermal load changes.

| Test specimens as shown in FIGS. | Number of thermal load changes | | | | | | | | | | | | |
|---|---|---|---|---|---|---|---|---|---|---|---|---|---|
| | 20 | 30 | 45 | 60 | 75 | 99 | 140 | 184 | 225 | 266 | 307 | 348 | 389 |
| 1 and 2 | 0 | 0 | 10 | 20 | 30 | 30 | 100% | | | | | | |
| 3 and 4 | 0 | 0 | 0 | 0 | 0 | 0 | 0 | 0 | 10 | 30 | 40 | 70 | 100% |
| 5 and 6 | 0 | 0 | 0 | 0 | 0 | 0 | 0 | 0 | 10 | 10 | 30 | 50 | 60% |

We claim:

1. A flat body, particularly for use as a heat sink for electronic power components, consisting of a ceramic slab, which is covered on both sides by metal plates which are firmly joined to the ceramic slab throughout their contact surface,
    characterized in that the metal plates have provided on at least two edges of the peripheral margins, a strip reduced in thickness to improve resistance to thermal shock.

2. A body according to claim 1, characterized in that the two metal plates are joined to the ceramic slab without an interlayer.

3. A body according to claim 1, characterized in that the metal plates attached to both sides of the ceramic slab are arranged to be coextensive.

4. A body according to claim 1, characterized in that the metal plates attached to both sides of the ceramic slab are identical.

5. A body according to claim 1, characterized in that the metal plates are made of copper.

6. A body according to claim 1, characterized in that the marginal strips of the metal plates are beveled.

7. A body according to claim 6, characterized in that the marginal strips are beveled at an angle of about 20° to the surface of the ceramic slab.

8. A body according to claim 1, characterized in that the marginal strips of the metal plates are stepped.

9. A body according to claim 8, characterized in that the marginal strips are stepped once and have a reduced thickness of 40% to 50% of the thickness of the metal plates.

10. A body according to claim 1, characterized in that the marginal strips have a reduced thickness and have a width which is 1 to 3 times the thickness of the metal plates.

11. A body according to claim 1, characterized in that the metal plates and the ceramic plates have a thickness of 0.5 mm to 1 mm.

12. A body according to claim 9, characterized in that the marginal strips have a reduced thickness of about 45 per cent of the thickness of the metal plates.

13. A body according to claim 10, characterized in that the marginal strips have a width which is 1.5 to 2 times the thickness of the metal plates.

14. A body according to claim 9, characterized in that the marginal strips have a reduced thickness and have a width which is 1 to 3 times the thickness of the metal plates.

15. A flat body, particularly for use as a heat sink for electronic power components, consisting of a ceramic slab which is covered on both sides by metal plates which are firmly joined to the ceramic slab throughout their contact surface, characterized in that the metal plates are smaller in planar size than said ceramic slab to define marginal strips extending about the peripheries of said metal plates.

16. A body according to claim 15, characterized in that peripheral edges of said plates are beveled.

17. A body according to claim 15, characterized in that at least two opposed peripheral edges of said plates are stepped.

* * * * *